United States Patent
Charles, Jr.

(10) Patent No.: US 8,466,563 B2
(45) Date of Patent: Jun. 18, 2013

(54) APPARATUS AND METHODS FOR 3-D STACKING OF THINNED DIE

(75) Inventor: Harry K. Charles, Jr., Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 238 days.

(21) Appl. No.: 13/110,400

(22) Filed: May 18, 2011

(65) Prior Publication Data

US 2012/0126430 A1    May 24, 2012

Related U.S. Application Data

(60) Provisional application No. 61/346,174, filed on May 19, 2010.

(51) Int. Cl.
*H01L 23/34* (2006.01)
*H01L 21/50* (2006.01)

(52) U.S. Cl.
USPC .... 257/777; 257/686; 257/723; 257/E21.499; 257/E23.08; 438/107; 438/109; 438/110

(58) Field of Classification Search
USPC ............ 257/777, 723, 686, E21.499, E23.08; 438/107, 109, 110
See application file for complete search history.

(56) References Cited

U.S. PATENT DOCUMENTS

| | | | |
|---|---|---|---|
| 5,904,499 | A | 5/1999 | Pace |
| 6,025,640 | A | 2/2000 | Yagi et al. |
| 6,406,938 | B2 | 6/2002 | Rodenbeck et al. |
| 6,780,672 | B2 | 8/2004 | Steele et al. |
| 6,974,723 | B2 | 12/2005 | Matayabas, Jr. et al. |
| 7,064,006 | B2 | 6/2006 | Akram |
| 7,282,794 | B2 * | 10/2007 | Akram .................. 257/686 |
| 7,285,431 | B2 | 10/2007 | Li et al. |
| 7,348,215 | B2 | 3/2008 | Lee |
| 7,494,843 | B1 | 2/2009 | Lin et al. |
| 7,576,432 | B2 | 8/2009 | Kim et al. |
| 7,611,923 | B2 | 11/2009 | Fasano et al. |
| 7,700,409 | B2 | 4/2010 | Jensen et al. |
| 2010/0093132 | A1 | 4/2010 | Elbanhawy et al. |

* cited by examiner

*Primary Examiner* — Thinh T Nguyen
(74) *Attorney, Agent, or Firm* — Noah J. Hayward

(57) ABSTRACT

Thinned die are attached to a flexible substrate and the die-substrate assembly is formed (wound) around multiple horizontal fingers of a heat removal buss structure such that the substrate below each die is in contact with one of the fingers. The fingers connect to a vertical support member that provides stability and a means of connecting the heat removal buss structure to the ambient.

17 Claims, 3 Drawing Sheets

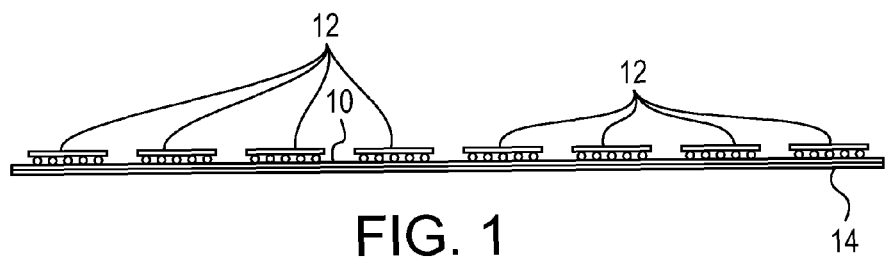
FIG. 1
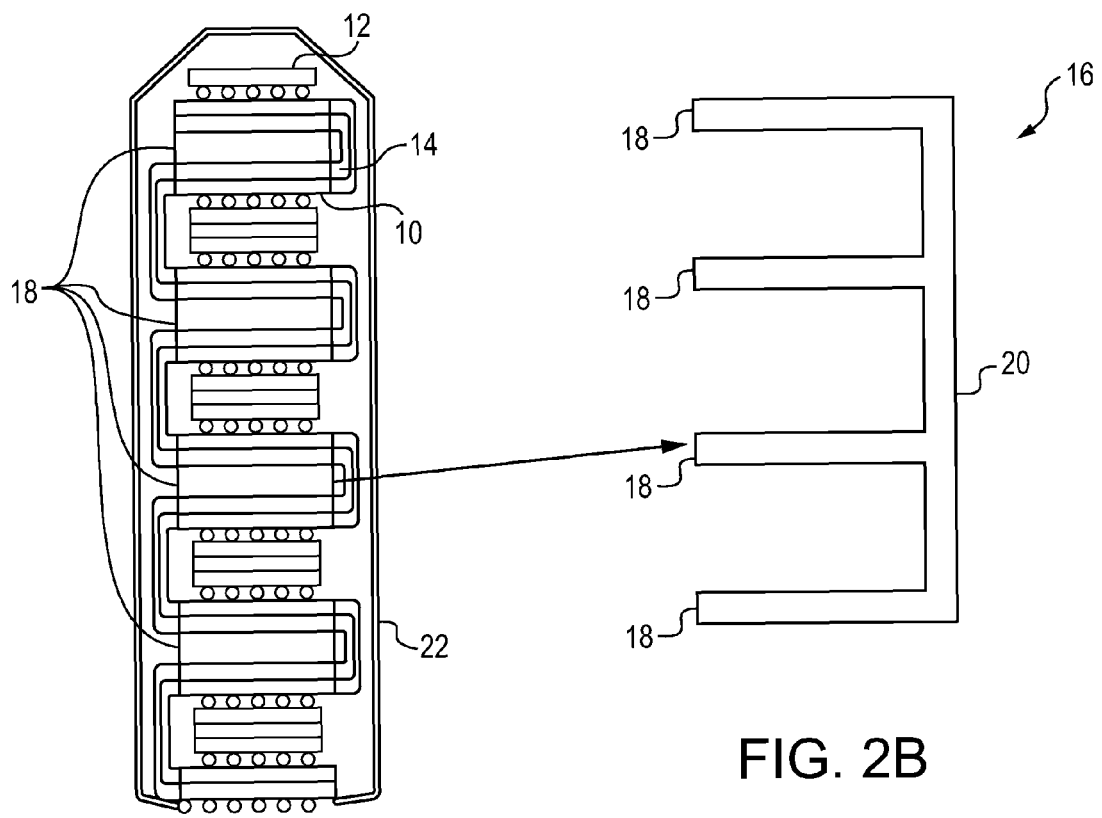
FIG. 2A
FIG. 2B imageAPPARATUS AND METHODS FOR 3-D STACKING OF THINNED DIE

CROSS-REFERENCE TO RELATED APPLICATIONS

This application relates to U.S. provisional application No. 61/346,174, filed on May 19, 2010, which is incorporated herein by reference in its entirety.

BACKGROUND OF THE INVENTION

The present invention relates to the mounting of integrated circuits on circuit boards and, more specifically, to the 3-D stacking of thinned die before mounting.

The development of thinned die on thin film flexible multilayer circuit boards has progressed to the demonstration state (see, for example, H. K. Charles, Jr., A. S. Francomacaro, S. J. Lehtonen, A. C. Keeney, G. V. Clatterbaugh, and C. V. Banda "Development of Ultra-thin Microelectronic Chip Assemblies", proc. 42$^{nd}$ International Symposium on Microelectronics, San Jose, Calif. Nov. 1-5, 2009; and U.S. patent application Ser. No. 11/756,816, filed Jun. 1, 2007, published Jan. 10, 2008, publication no. 2008/0009095, the contents of both being incorporated herein by reference in their entireties).

The microelectronic assemblies, as described in the above references, are for planer applications in which the heat removal from the die is envisioned to be accomplished through the substrate. While these assemblies are extremely flexible and have a myriad of applications ranging from curved surface appliqués to embedded clothing devices, they are planar in nature.

Recent trends in modern electronic packaging have stressed the need to preserve surface real estate by stacking components one on top of the other. Stacking presents the circuit developer with two major challenges: 1) connecting the various die on the vertical stack and 2) removing the heat, since the power density on a given volume increases rapidly upon stacking.

What is needed then are apparatus and methods for stacking thinned die that address both of the above concerns while still keeping stacked component size small.

SUMMARY OF THE INVENTION

Therefore, the present invention has been made in view of the above problems and constraints, and provides apparatus and methods to achieve the above objectives.

More specifically, the present invention is directed to a method for stacking a plurality of integrated circuits comprising: mounting the plurality of integrated circuits on a flexible substrate to form an assembly; winding the assembly around a means for removing heat, the heat removing means comprising: a vertical support member; and a plurality of horizontal fingers attached to the vertical support member around which the assembly is wound.

The present invention is further directed to a 3-D stack of a plurality of integrated circuits comprising: a vertical support member; and a plurality of horizontal fingers attached to the support member; and an assembly wound around the plurality of horizontal fingers, the assembly comprising: a flexible substrate; and the plurality of integrated circuits mounted on the flexible substrate.

The present invention is further directed to a method for stacking a plurality of integrated circuits comprising: mounting a first portion of the plurality of the integrated circuits on a first flexible substrate; mounting a second portion of the plurality of the integrated circuits on a second flexible substrate; placing the non-integrated circuit side of the first and second flexible substrates together to form a double-sided assembly; winding the assembly around a means for removing heat, the heat removing means comprising: a vertical support member; and a plurality of horizontal fingers attached to the vertical support member; wherein the assembly is wound around the plurality of horizontal fingers such that each of the backs of the plurality of integrated circuits is in contact with one of the plurality of horizontal fingers.

The present invention is further directed to a 3-D stack of a plurality of integrated circuits comprising: a means for removing heat comprising: a vertical support member; and a plurality of horizontal fingers attached to the support member; and a double-sided assembly wound around the plurality of horizontal fingers, the double-sided assembly comprising: a first flexible substrate; a second flexible substrate; a first portion of the plurality of integrated circuits mounted on the first flexible substrate; a second portion of the plurality of integrated circuits mounted on the second flexible substrate; wherein the non-integrated circuit side of the first and second flexible substrates are placed together to form the double-sided assembly; wherein the double-sided assembly is wound around the plurality of horizontal fingers such that each of the backs of the integrated circuits is in contact with one of the plurality of horizontal fingers.

Those and other objects and advantages of the present invention will be fully apparent from the following description, when taken in connection with the annexed drawings.

BRIEF DESCRIPTION OF THE DRAWINGS

The teachings of the present invention can be readily understood by considering the following detailed description in conjunction with the accompanying drawings, in which:

FIG. 1 illustrates a cross-sectional view of a typical multi-integrated circuit chip planar assembly using thinned die on an ultra thin-film flexible multilayer substrate with integral flexible heat spreading layer.

FIG. 2, consisting of FIGS. 2A and 2B, illustrates, respectively, a front view of an assembly as shown in FIG. 1 but consisting of nine integrated circuits wound around a heat removal buss structure, the combined assembly and buss structure being encapsulated, and a side view (rotated 90° from FIG. 2A) of the buss structure alone.

DETAILED DESCRIPTION

Figure 3:
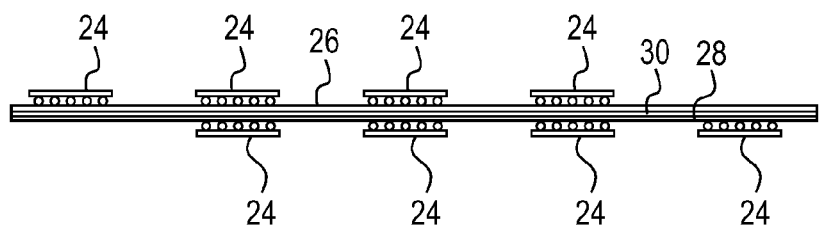
FIG. 3 illustrates multiple thinned integrated circuit chips on a double-sided thin film, flexible substrate with an integral flexible heat spreading core between the substrates.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail.

Reference will now be made in detail to the exemplary embodiments of the present invention, examples of which are illustrated in the accompanying drawings.

A typical multichip planar assembly using thinned die on an ultra thin, flexible multilayer substrate 10 is shown in FIG. 1. In this cross-sectional view, the various thinned integrated circuits 12 are flip chip mounted using low profile solder bump technology. As pictured in FIG. 1, the substrate reverse side (non-chip bearing side) has an integral thin film heat spreading layer 14 comprised of either thin copper foil, a diamond thin-film, or a composite layer containing carbon nanotubes. This heat spreading layer along with the original substrate is thin and compliant enough to allow circuit bending.

Once the chips are assembled and the substrates are released following the techniques described in the references incorporated by reference above, the chip-substrate assembly as shown in FIG. 1 is formed (wound) around the multiple fingers 18 of a heat removal buss structure 16 (in FIG. 2B) as shown schematically in FIG. 2A. The heat removal buss structure 16 is constructed of metal or a high thermal conductivity ceramic and/or composite or other material which can then radiate over a much larger area or be tied to a thermal sink point. The buss structure's multiple fingers 18 allow the substrate below each die to come in contact with one of these fingers. The fingers connect to a vertical support member 20 which provides stability and a means of connecting the heat removal buss structure to the ambient (direct-conduction to the board or fins for convection or liquid cooling (to be described below)).

The assembly in FIG. 2 supports nine encapsulated stacked die to form a 3-D part with an overall assembly height of 2 to 3 mm. This assumes the thickness of each heat removal finger is 0.5 mm and has a width of 5 mm. If the heat removal structure is made from copper ($\sigma_{thermal}$=400 W/m·K) than an overall thermal resistance of 10° C./W or less can be achieved from an individual die to the ambient. This would allow each individual die to dissipate up to 1 watt while the slack temperature remains at a safe level. Increasing the thickness of the vertical finger connection member could reduce the overall thermal resistance and allow even greater heat dissipation. Once stacked around the heat removal member, the parts are encapsulated 22 and the special substrate pads set aside for stacked interconnection/module attachment are bumped, thus completing the part.

A means for shortening the stack and providing for even greater heat removal is shown in FIG. 3. FIG. 3 is a double-sided assembly of thin integrated circuit chips 24 on two thin-film, flexible multilayer substrates 26, 28 with a thin flexible heat spreading core or layer 30, such as a diamond thin-film, carbon nanotube composite layer, or thin copper foil, in between.

Figure 4A:
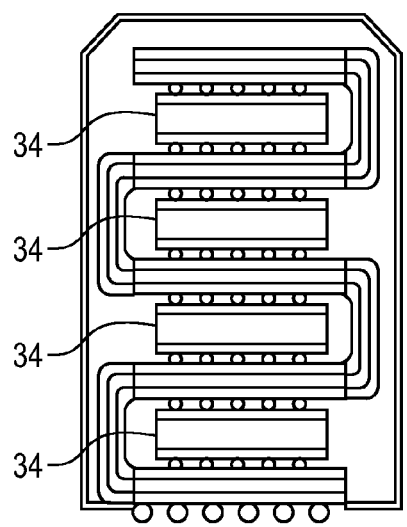
FIG. 4, consisting of FIGS. 4A and 4B, illustrates, respectively, a front view of the chip-substrate assembly of FIG. 3 wound around a heat removal buss structure with the combined assembly and buss structure being encapsulated, and a side view (rotated 90° from FIG. 4A) of the buss structure alone.
Figure 4B:
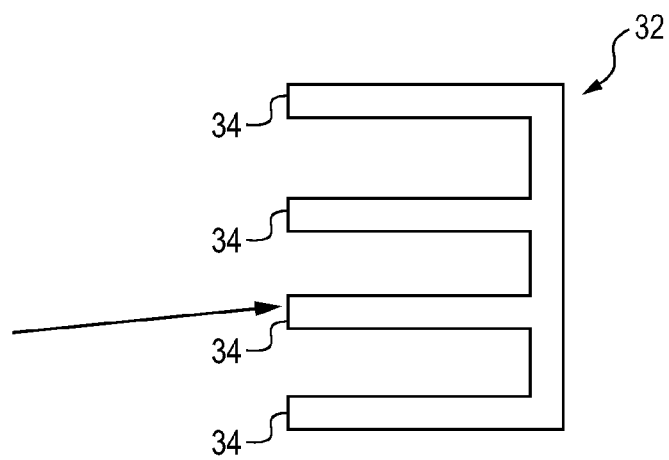

In this arrangement, the assembly is wound around the heat removal bus structure 32 (in FIG. 4B) in such a manner that the individual die backs are in contact with the heat removal fingers 34 as shown in FIG. 4A. This configuration couples the chip heat directly to the heat removal fingers (copper or other high thermal conductivity material which can then radiate over a much larger area or be tied to a thermal sink point). Coupling of the die backs to the heat removal fingers is achieved by means of a diamond or carbon nanotube filled material. In this technique the intervening substrate and the required thermal path through the solder balls is eliminated.

Thermal performance of this configuration will exceed that of the single-sided stack. Encapsulation and interconnect bumping of this assembly will be consistent with the method described above for the single-side stack. Encapsulates for both stacks should be loaded with a high thermal conductivity filler such as SiC, AlN, $Al_2O_3$, and/or diamond.

The heat removal finger buss structure can occur in several variants some of which are shown in FIGS. 5 and 6. FIG. 5A illustrates the standard heat removal buss structure with the vertical connection member the same size as the horizontal heat collection fingers. FIG. 5B illustrates a doubling of the cross sectional area of the vertical structure to reduce the overall thermal resistance by as much as 25%. FIG. 5C shows this vertical member finned to allow for even greater heat removal by means of convection. FIG. 5D illustrates a double heat removal vertical member. The second member would be attached to the original buss structure after circuit stacking by, for example, machine screws. A compliant heat removal medium (not shown) would be placed at the points of contact between the bolt and the member and the heat removal fingers.

Figure 5A:
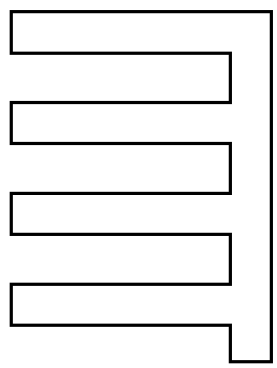
FIG. 5, consisting of FIGS. 5A, 5B, 5C and 5D, illustrates, respectively, a standard four finger heat removal structure with a vertical member having substantially the same cross-section as the fingers; a vertical member having a cross-section substantially double that of the fingers; vertical member with heat sink fins; and second vertical member attached to the fingers.
Figure 5B:
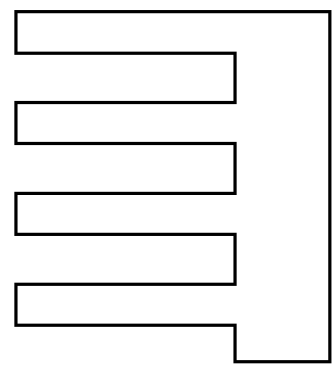
Figure 5C:
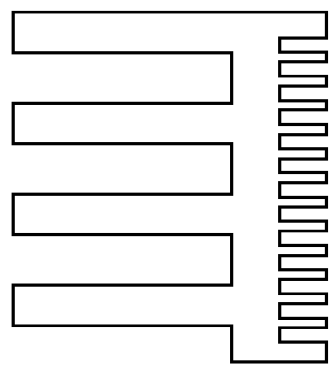
Figure 5D:
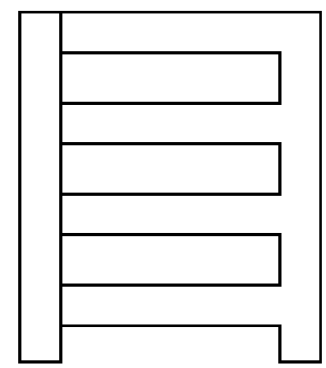
Figure 6A:
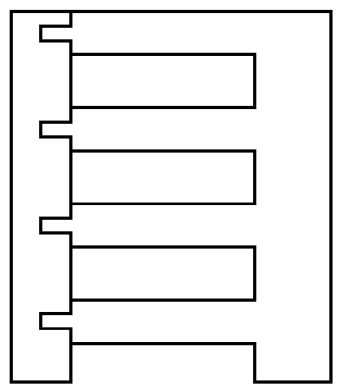
FIG. 6, consisting of FIGS. 6A and 6B, illustrates, respectively, the same configuration as FIG. 5D except with an added "snap on" vertical heat removal member; and a "bolt on" member with heat removal fins.
Figure 6B:
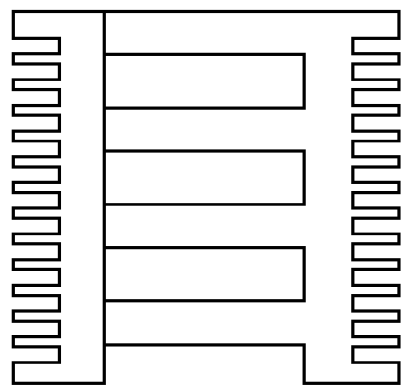

FIG. 6A illustrates a similar configuration as FIG. 5D except the added vertical heat removal member is made to "snap on". FIG. 6B illustrates a "bolt on" member with heat removal fins. Rather than being solid, the heat removal buss structure could be porous or infused with microchannels, thus allowing for active cooling to further improve thermal performance. The heat removal buss structure could also contain miniature heat pipes.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method for stacking a plurality of integrated circuits, the method comprising:
   mounting the plurality of integrated circuits on a flexible substrate to form an assembly; and
   winding the assembly around a heat removing means, the heat removing means comprising:
   a vertical support member; and
   a plurality of horizontal fingers attached to the vertical support member around which the assembly is wound.

2. The method as recited in claim 1, further comprising:
   attaching a heat spreading layer to the non-integrated circuit side of the flexible substrate; and
   contacting the heat spreading layer with the plurality of horizontal fingers when the assembly is wound around the plurality of horizontal fingers.

3. The method as recited in claim 2, further comprising encapsulating the combined heat removing means and the assembly.

4. The method as recited in claim 3, further comprising bumping a substrate pad for attaching the combined heat removing means and the assembly to a circuit board.

5. A 3-D stack of a plurality of integrated circuits comprising:
- a heat removing means comprising:
  - a vertical support member; and
  - a plurality of horizontal fingers attached to the support member; and
- an assembly wound around the plurality of horizontal fingers, the assembly comprising:
  - a flexible substrate; and
  - the plurality of integrated circuits mounted on the flexible substrate.

6. The 3-D stack as recited in claim 5, the assembly further comprising a heat spreading layer attached to the non-integrated circuit side of the flexible substrate, the heat spreading layer being in contact with the plurality of horizontal fingers.

7. A method for stacking a plurality of integrated circuits, the method comprising:
- mounting a first portion of the plurality of the integrated circuits on a first flexible substrate;
- mounting a second portion of the plurality of the integrated circuits on a second flexible substrate;
- placing the non-integrated circuit side of the first and second flexible substrates together to form a double-sided assembly; and
- winding the assembly around a heat removing means for removing heat, the heat removing means comprising:
  - a vertical support member; and
  - a plurality of horizontal fingers attached to the vertical support member,
- wherein the assembly is wound around the plurality of horizontal fingers such that each of the backs of the plurality of integrated circuits is in contact with one of the plurality of horizontal fingers.

8. The method as recited in claim 7, further comprising placing a heat spreading layer between the first and second flexible substrates.

9. A 3-D stack of a plurality of integrated circuits comprising:
- a heat removing means comprising:
  - a vertical support member; and
  - a plurality of horizontal fingers attached to the support member; and
- a double-sided assembly wound around the plurality of horizontal fingers, the double-sided assembly comprising:
  - a first flexible substrate;
  - a second flexible substrate;
  - a first portion of the plurality of integrated circuits mounted on the first flexible substrate; and
  - a second portion of the plurality of integrated circuits mounted on the second flexible substrate,
- wherein the non-integrated circuit side of the first and second flexible substrates are placed together to form the double-sided assembly, and
- wherein the double-sided assembly is wound around the plurality of horizontal fingers such that each of the backs of the integrated circuits is in contact with one of the plurality of horizontal fingers.

10. The 3-D stack as recited in claim 9, further comprising a heat spreading layer between the first and second substrates.

11. The 3-D stack as recited in claim 9, wherein diamond or carbon nanotube material couples the backs of the integrated circuits to the plurality of horizontal fingers.

12. The 3-D stack as recited in claim 5, wherein the vertical support member and the plurality of horizontal fingers have substantially the same cross-section.

13. The 3-D stack as recited in claim 5, wherein the cross-section of the vertical support member is double the cross-section of the plurality of horizontal fingers.

14. The 3-D stack as recited in claim 5, wherein the vertical support member is finned.

15. The 3-D stack as recited in claim 5, wherein the heat removing means comprises a second vertical support member.

16. The 3-D stack as recited in claim 5, wherein the heat removing means is infused with microchannels.

17. The 3-D stack as recited in claim 6, the heat spreading layer comprising one of a thin copper foil or a composite comprising carbon nanotubes.

* * * * *